United States Patent [19]

Krumholz et al.

[11] Patent Number: 4,851,835
[45] Date of Patent: Jul. 25, 1989

[54] CAPACITIVE ROTARY TRANSMITTER FOR CONTROLLING AND POSITIONING DISPLACED OBJECTS

[76] Inventors: Claus-Peter Krumholz; Thomas Walter, both of c/o Hengstler GmbH, Uhlandstrasse 16, 7209 Aldingen, Fed. Rep. of Germany

[21] Appl. No.: 91,507

[22] Filed: Aug. 31, 1987

[30] Foreign Application Priority Data

Sep. 2, 1986 [DE] Fed. Rep. of Germany ....... 3629792
Nov. 4, 1986 [DE] Fed. Rep. of Germany ....... 3637529

[51] Int. Cl.[4] .................. G08C 19/10; G08C 19/16
[52] U.S. Cl. ........................ 340/870.370; 324/61 R; 318/662
[58] Field of Search .............. 340/870.370, 870.300; 324/61 R, 60 C, 166; 361/292, 280; 318/662, 661; 341/112, 145, 156

[56] References Cited

U.S. PATENT DOCUMENTS

| | | | |
|---|---|---|---|
| 4,092,579 | 5/1978 | Weit | 318/662 |
| 4,238,781 | 12/1980 | Vercellotti et al. | 340/870.37 |
| 4,268,889 | 5/1981 | Wolfendale | 340/870.37 |
| 4,755,731 | 7/1988 | Anthony et al. | 324/61 R |

Primary Examiner—Donald J. Yusko
Assistant Examiner—Tyrone Queen
Attorney, Agent, or Firm—Paul H. Gallagher

[57] ABSTRACT

A capacitive linear or rotary transmitter for controlling and positioning displaced objects by measuring the displacement, angle or speed of the displaced object is formed, in one embodiment as a rotary transmitter, by two mutually opposed stators defining a reciprocal spacing, their gap having rotatably arranged in it a rotor which is rotatably coupled to a spindle which is coupled to the displaced object. Capacitive values varying during the rotation of the rotor may be measured in the air gaps produced in each case between one stator and the rotor, and the other stator and the rotor. To attain a superior degree of precision and resolution, coatings are so arranged on the rotor and the stators, as to produce at least two concentric annular areas, of which one area forms the measurement track of a coarse measuring system and the other area forms the measurement track of a precision measuring system. The digitally determined values of the coarse measuring system are so combined with the values of the precision measuring system as to yield an unequivocally defined absolute value for the angle of rotation. This is attained by the fact that the coupling capacitances generated by mutually associated coatings of the rotor and stators follow a course during the rotary displacement of the spindle which is sinusoidal in parts and that by addition of several reciprocally displaced capacitance graphs which extend sinusoidally in parts and are provided with different prefixes, an approximately purely sinusoidal capacitance graph is generated with a cycle depending on the number of measurement tracks.

13 Claims, 13 Drawing Sheets

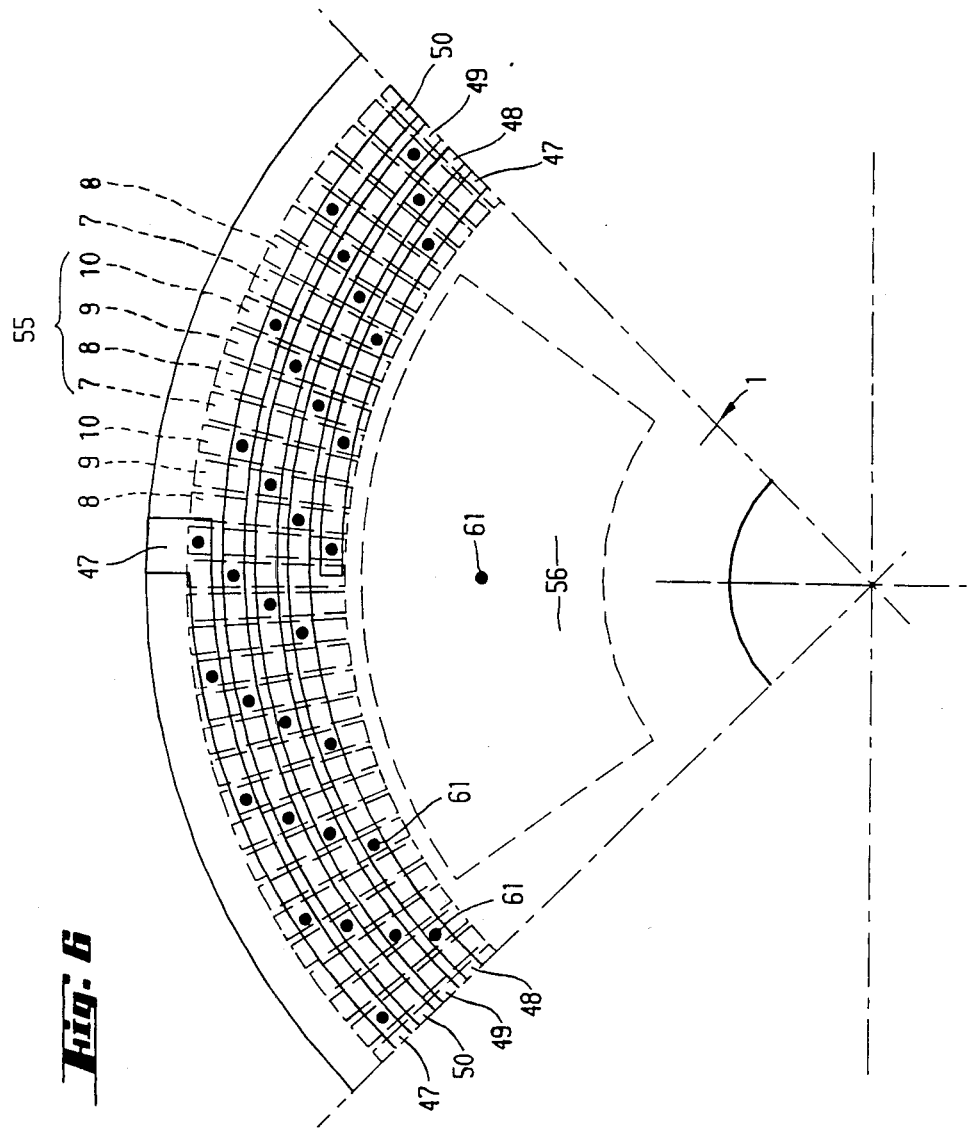

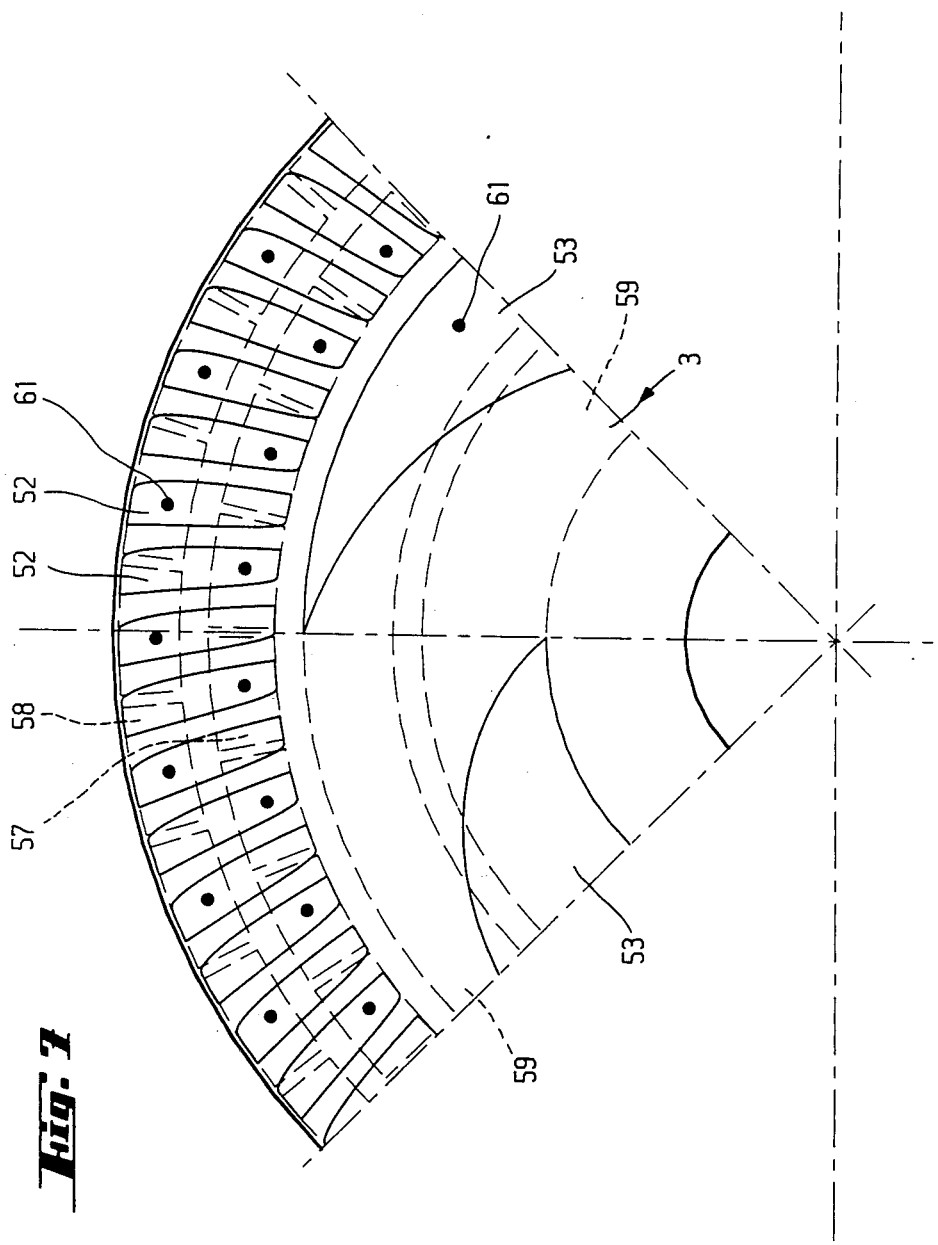

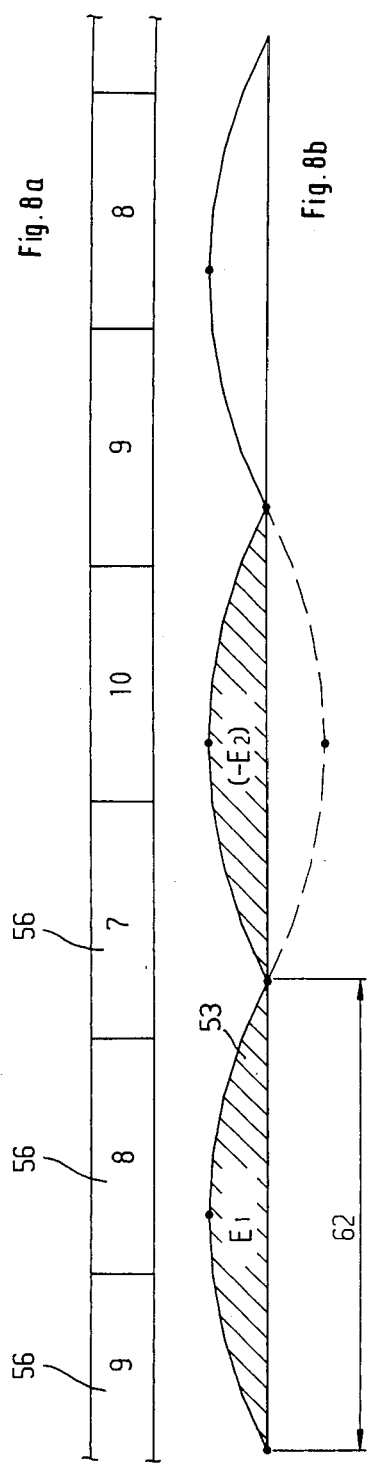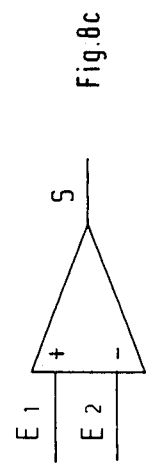
Fig.8d
ERROR = AMPLIFICATION * (E1−E2)
ERROR(ELECTRICAL ANGLE, MECHANICAL ANGLE)=
AMPLITUDE * SIN(ELECTRICAL ANGLE − MECHANICAL ANGLE − OFFSET)

CAPACITIVE ROTARY TRANSMITTER FOR CONTROLLING AND POSITIONING DISPLACED OBJECTS

BACKGROUND OF THE INVENTION

This invention relates to a capacitive linear or rotary transmitter for controlling and positioning displaced objects by measuring the displacement, angle or speed of the displaced object, which in one embodiment as a rotary transmitter is formed by two mutually opposed stators defining a reciprocal spacing, the gap of which has rotatably arranged in it a rotor which is rotatably coupled to a spindle coupled to the displaced object, a first air gap (measurement air gap) being formed between one stator and the rotor, and a second air gap (decoupling or balancing air gap) being formed between the other stator and the rotor, with electrically conductive coatings situated in each case on mutually confronting sides of the stators and of the rotor which together with the associated air gap form capacitors in each case, the capacitance value of which varies with the rotation of the rotor.

A rotary transmitter of this nature has been disclosed, for example in U.S. Pat. No. 4,238,781. A disadvantage of this known rotary transmitter consists in that a phase displacement of an output signal is evaluated as a function of the angle of rotation which leads to a comparatively complex evaluator circuit which has little precision. This known rotary transmitter is a transmitter for application in an electricity meter which is to be utilised to read the current consumption in households and which merely serves the purpose of drawing a distinction between ten digits and of producing these in digital form at an output means.

A rotary transmitter of this kind is consequently unsuitable for high-precision positioning particularly of machine elements on machine tools, in which it is essential to differentiate within the range of fractions of minutes of angle. As for the rest, the U.S. Pat. No. 4,238,781 does not disclose any precisely sinusoidal capacitance graph for the coupling capacitors, because the coverage density of the coatings on the one stator over the angle of rotation lacks the configuration required for this purpose. This restricts the obtainable precision. Beyond this factor, the condition applies in respect of the coatings on the rotor, that these cannot generate two sinusoidal halfwaves because they do not extend along an angle of rotation of 180°. The obtainable precision is impaired additionally, thereby.

The invention consequently has as its fundamental object to develop a rotary transmitter of the kind defined in the foregoing in such manner that it has a substantially improved resolution with superior precision and reduced complexity of the circuitry.

SUMMARY OF THE INVENTION

For resolution of the problem posed, the invention is characterised in that the coatings are so arranged on the rotor and the stators as to produce at least two concentric annular areas, of which one area forms the measurement track of a coarse measuring system and the other area forms the measurement track of a precision measuring system, the coatings of the precision measuring system being periodically arranged with respect to a fraction of 360° on circular tracks of the rotor and stators, whereas the coatings of the coarse measuring system are periodic with respect to 360°, that the coupling capacitances generated by mutually associated coatings of the rotor and stators establish a graph along the rotary displacement of the spindle which is sinusoidal in parts, and that by addition of several reciprocally displaced capacitance traces extending sinusoidally in parts and bearing different prefix signs, an approximately purely sinusoidal capacitance graph is produced which has a cycle of $360°/n_i$, $n_i$ being a whole natural integer denoting the pole pair number of the measurement track in question and the index i denoting the number of measurement tracks.

It is consequently a feature of the present invention that a precision track is added to a coarse track—which is known per se—and which in combination with the coarse track resolves the problem posed in accordance with the invention, namely that of evaluating angles of rotation with high precision and great resolution.

By the addition of a precision track to the essentially known coarse track, the rotary transmitter according to the present invention acquires superior qualities, since error correction mechanisms are made possible thereby, e.g. such as averaging out of statistical scalar faults and localised defects, and primarily automatic balancing of tilting actions of the rotor disc with respect to the two stator discs or plates.

Whereas faults of this kind (scalar errors, localised defects and tilting deviations) caused a substantial impairment of the precision in the case of the rotary transmitter according to U.S. Pat. No. 4,238,781, the actions of faults of this nature may be evaluated and thus eliminated according to the teachings of the present invention.

In a preferred embodiment, a spindle is rotatably mounted in the casing via two ball-bearings. A circular disc or plate, being the rotor, is fixedly coupled to said spindle via a boss.

The rotor is situated parallel to and between two stator discs, which are fixedly joined to the casing and from which the rotor is separated by air gaps.

The rotor and stators are made of insulating base material. Conductor track patterns are really formed on the surfaces of the rotor and stators. The conductor track patterns of the two stators are connected via leads or the like to the electronic system, e.g. which is situated on the "SMD" board.

A three-disc system will be described.

The stator, rotor and stator follow one another in this sequence. The measurement air gap extends between the one stator and the rotor. The decoupling air gap lies between the rotor and the other stator. Concentric annular areas (being two in our case) are in each instance formed at different radii on all three discs, wherein are situated appropriate conductor tracks.

Each of these areas represents a measurement track, being a coarse track and a precision track, in this case. Each measurement track represents a measuring system in cooperation with its electronic track evaluation system.

In particular, the pattern of the precision track is periodic with respect to a fraction of 360°, and with respect to 360° in the case of the coarse track.

In general terms, the ith track has a measurement range of $360°/n_i$, $n_i$ being a positive integer and indicating the pole pair number of the track. To this end, angles displaced in each case by multiples of $360°/n_i$ provide the same reading.

By combination of the tracks, it is possible to interlink the large measurement range of the one track (coarse track) with the precise measurement resolution of the other (precision track), in such manner that a transducer possessing precise resolution and a large measurement range is produced.

The conductor track patterns (coatings) on the mutually confronted sides of the one stator and the rotor separated from each other by the measurement air gap, are capacitor coatings of a capacitor grid, the capacitance values of which depend on the angle of rotation (measurement capacitor system). The conductor track patterns on the mutually confronted sides of the rotor and the other stator form capacitors, the capacitance values of which are ideally wholly unaffected by the angle of rotation; this is why these merely implement a decoupling function and the separating air gap is referred to as a decoupling air gap.

Altogether at least four "kinds" of coatings represent the measurement capacitor system. Coatings of the same "kind" are situated on the same surface and are displaced by a multiple of $360°/n_i$ with respect to the centre of the ring on which the measurement track is present, and operate in identical manner. The coatings of the same "kind" on the one stator are jointly connected to an electrical signal, via through-contacts and connections at the rear side; the coatings of the rotor are extended individually through the same by means of through-contacts and decoupled at a radial section depending on the "kind", the signals from individual coatings of the rotor of the same "kind" being interconnected and electronically evaluated only after the decoupling action in the other stator.

Four kinds of coatings of identical shape are present on the one stator in the construction described and are arranged in positions shifted by $$j \times \frac{360°}{4 \times n_i} + k \times \frac{360°}{n_i}$$

(k being an optional integer) for each "kind" j (from 1 to 4) with respect to a "zero point angle".

Two "kinds" 1 of coatings are arranged on the rotor under displacement by $$l \times \frac{360°}{2 \times n_i} + k \times \frac{360°}{n_i}$$

with respect to a zero angle which is fixed as regards the rotor.

Each "kind" of coating of the one stator has a coupling capacitance with each other "kind" of coating of the rotor, which has a graph along the rotary displacement of the spindle which is sinusoidal in parts.

Purely sinusoidal capacitance graphs having the cycle $360°/n_i$ are produced by addition of several reciprocally displaced partly sinusoidal capacitance traces tagged by different prefix signs.

Just these displacements are caused by the displaced layouts of the patterns, the changes of prefix signs and the addition occurring electronically.

The partial sinusoidal capacitance trace is produced by the shape imparted by the coatings.

These should be shaped so that the areas of overlap of the coatings vary sinusoidally in part during rotary displacement. An infinity of possibilities arises for this purpose. That selected for practical embodiment is based on the coatings of the one stator having a charge density $$dA(\theta) = \text{constant}$$

within an angular range which is established, whereas a charge density $$dA(\theta) = \sin(n_i \times \theta)$$

is applicable for the coatings of the rotor within an angular range which is to be established, preferably of the amplitude $180°/n_i$.

Conversely too, a constant charge density of the rotor and a sinusoidal charge density of the stator are possible. Furthermore, both coatings may also have the sinusoidal function.

Supplemental areas which mutually cancel their effects (effective overlap or superimposition surfaces) may moreover also be added or subtracted.

The (four) kinds of coatings of the one stator are energised by electrical signals. Let these signals be
1. $U_1 = U_o \bmod \times \sin(n_i \times \phi)$
2. $U_2 = U_o \bmod \times \cos(n_i \times \phi)$
3. $U_3 = U_o \bmod \times (-\sin(n_i \times \phi))$
4. $U_4 = U_o \bmod \times (-\cos(n_i \times \phi))$ in which $U_o$ is defined as a modulation voltage and $\phi$ the so-called electrical angle.

The (two) kinds of coatings of the rotor are connected to a preamplifier in phase-opposition after decoupling with respect to the other stator. Its output signal is demodulated. The signals,
1. $\cos(n_i \times \theta)$
2. $-\sin(n_i \times \theta)$
3. $-\cos(n_i \times \theta)$
4. $\sin(n_i \times \theta)$ produced via the capacitive coupling system contribute to this output signal (in the case of an optionally selected wiring layout).

Consequently:

$$U_{out} = U_o \bmod \times \sin(n_i \times \phi) \times \cos(n_i \times \theta) + U_o \bmod \times$$
$$\cos(n_i \times \phi) \times (-\sin(n_i \times \theta)) + U_o \bmod \times (-\sin(n_i \times \phi)) \times$$
$$(-\cos(n_i \times \theta)) + U_o \bmod \times (-\cos(n_i \times \phi)) \times \sin(n_i \times \theta)$$

Demodulation and conversion produce:

$$U_{out} = U_o \, demod \times (1/2 \sin n_i(\phi - \theta) + 1/2 \sin n_i(\phi + \theta) -$$
$$1/2 \sin n_i(\theta - \phi) - 1/2 \sin n_i(\phi + \theta) + 1/2 \sin n_i(\phi - \theta) +$$
$$1/2 \sin n_i(\phi + \theta) - 1/2 \sin n_i(\theta - \phi) - 1/2 \sin n_i(\phi + \theta)) =$$
$$U_o \, demod \times 2 \times \sin n_i(\phi - \theta)$$

The output signal consequently provides the sine of the difference between the mechanical and electronic angles (times a constant) multiplied by $n_i$; this signal may be adjusted to zero by appropriate variation of $\phi$; the following then applies:

$$\theta = \phi$$

If $\phi$ is illustrated for discreet values only, $U_{out}$ may be controlled at zero only for discreet values of $\phi$ and otherwise indicates the deviation of $\theta$.

Since the sine function is approximately linear close to zero, a control action of this kind may also be stable; only one of the two zero crossings per cycle is stable in a control action.

The control sensitivity, and thus the reading resolution, rise linearly with the pole pair number $n_i$, $\phi$ however being unequivocal only for $n_i=1$, since precisely $n_i$ stable zero points, and thus an ambiguity of $\phi$ arise, within a mechanical angular range of 360° at higher pole pair numbers; this is why a track for which $n_i=1$ is utilised in transmitters operating on an absolute level.

A track evaluation electronic system is required for each measurement track, which determines the position within the scale cycle $360°/n_i$ with a resolution of $a_i$ bits, for example where $a_i$ is an integer greater than zero. The chronology of these track evaluations is determined by a logic control system (referred to as master timing in this case) which combines the measurement results into an overall measurement result in a logic signal combination system.

The track evaluation occurs in a control loop which is constructed as a kind of capacitance measuring bridge. In the same, the "electrical angle" is constantly made to follow the mechanical angle. This electronic angle is stored in a counter by means of $a_i$ bits. The aforesaid energising voltages of the capacitance measuring bridge $$U_1 = U_o \bmod \times \sin(n_i \times Z_i \times 360°/2^{a_i})$$

$$U_2 = U_o \bmod \times \cos(n_i \times Z_i \times 360°/2^{a_i})$$

$$U_3 = U_o \bmod \times (-\sin(n_i \times Z_i \times 360°/2^{a_i}))$$

$$U_4 = U_o \bmod \times (-\cos(n_i \times Z_i \times 360°/2^{a_i}))$$

are derived from the same, at its counter reading $Z_i$. A sawtooth voltage having the frequency $f_i$ is selected as the modulating voltage in this case. The push-pull signal decoupled from the track is fed to a high-ohmic preamplifier of the "FET" type, is demodulated, and then contains the deviation of the existing mechanical angle from the stored electronic angle. This is fed to a control amplifier having the required control characteristic. After one cycle of the modulation voltage, a decision is reached by means of a "window" comparator as to whether $Z_i$ should be incremented, decremented or remain unchanged; the maximum regoverning frequency or bit change frequency of the result thus amounts to $f_1$.

If the reading is to be "tracked", e.g. at a maximum r.p.m. value of 6000 r.p.m., corresponding to 100 Hz, the modulation frequency should be selected to be at least $$f_i = n_i \times 2^{a_i} \times 100 \text{ Hz}$$

(in the case of our precision track: $n_i=16$, $a_i=6$, so that $f_i \geq 102.4$ kHz).

All the control signals of the track evaluation operation are derived from a frequency generator via a counter and gate circuit.

Apart from the modulation frequency for the capacitance bridge, these are demodulator signals, "latch" signals for scanning and retention of the measurement results of each measurement period, as well as clock or timing signals for the incrementation and decrementation of the electronic angle. If, to this end, the modulation frequencies of the individual tracks are so selected that they differ by a power of two, a signal transfer of the tracks is prevented in the case of a sawtooth shape.

In the case of the signal combination, the bits of lowest value of the result are taken over direct from the precision track (or rather the track with the greater $n_i$). The bits of higher value are obtained by means of a combination of the results of both tracks (or rather of two in each case, if there are several tracks). In particular, this occurs because an area of overlap of both tracks is produced, i.e. both tracks supply a measurement value or "bits" for this area or range of overlap. These should be identical in an ideal case, but will differ one from the other because of zero displacements between the two tracks, measurement faults and control drifts of the coarse track. These deviations are detected in the area of overlap for as long as they remain below a maximum acceptable limiting value, and the remaining bits of higher value are commensurately corrected decrementally or incrementally.

In a practical embodiment, the two tracks have their zero points deliberately displaced in such manner that instead of incrementing and decrementing, the bits of higher value are incremented only or remain unchanged, which simplifies the circuitry.

Two error mechanisms have to be examined in view of the principle applied, being that of dividing the measurement task into two subsidiary systems. The first possible fault is the failure of the combination of signals. In this case, the measurement error of the coarse track would rise to a level such that the permissible signal combination range is exceeded and that a defective correction of the coarse value is performed. Since this would lead to a sudden change of the measurement value by a multiple of the bit of the lowest value, a fault of this kind must be prevented. This may be accomplished by appropriate division of the measurement ranges.

All other errors relate to inaccuracies regarding the order of magnitude of the measurement resolution. In view of the principle applied, no more than errors on the precision track (or rather that displaying the highest resolution, in the case of more than two tracks) need be considered in this respect. This will be the track having the greatest radius, for this reason.

The principle of the transmitter is however endowed with some self-correcting qualities:

It is precisely in the case of highly precise optical transmitters that the eccentricity of the coding disc is very critical. Since a reading is taken at one point of the scale only, an eccentricity dE induces a measurement error of at most $$d\theta = \frac{dE}{r}$$

In the case of the principle proposed, a measurement is however performed simultaneously throughout the scale, the eccentricity acting with different prefix signs at different points (coatings) and the effect of the eccentricity disappearing almost completely for this reason.

Scalar or graduation defects caused by faults in the original, defective etching, etc, are reduced statistically by utilising a plurality of measurement points. Since it is precisely the precision track which has a large number of measurement points and these are decisive regarding the final precision, this statistical reduction may be put into effect in a particularly satisfactory manner.

The method is also comparatively unaffected by the tilting of the rotor or of a stator. As a matter of fact, since the measurement signals from the one stator are coupled to the individual insulated coatings of the rotor and are recombined again in the other stator, it is permissible to refer to a plurality of individual measurement areas. If the rotor moves towards the one stator at one point, the distance from the other stator increases at the same time, while the signal coupling action and the contribution of this measurement area to the overall measurement area remains almost constant. Although a shift of a stator may well alter an air gap, the other remains constant however, so that the overall effect is reduced.

The precision of the interpolating action is affected by the graph shapes and zero displacements of the sine and cosine networks which are generated. These requirements are reduced however by the pole pair number $n_i$ of the most precise track as compared to resolution evaluator circuits.

Leak or stray capacitances on the one hand, upon being balanced out (made identical), as well as electrical interference effects on the other hand, are suppressed by the application of a push-pull energisation procedure.

The modulation frequency may furthermore be so selected that the transmitter becomes largely insensitive to known interference spectra.

Due to the self balancing measurement bridge, even fluctuating amplifying factors remain ineffective, since it is only the alignment sensitivity which varies and the latter also loses critical status (I-behaviour) in the case of an appropriate control characteristic.

If a brief measurement error were to arise despite this, this is corrected again by subsequent measurements since the system is of the absolute measurement type.

Absolute angle transmitters are frequently applied in positional control systems. To improve the dynamic operation of such control circuits, the speed of displacement is occasionally also detected, apart from the position.

A second transmitter element, namely an tachogenerator, had hitherto frequently been necessary in such cases. The speed datum may however also be derived from the positional signal by differentiation. The transmitter proposed in this case is apt to supply a speed signal of this kind: to this end, the clock signal energising the electronic counter is fed to an appropriate frequency-voltage converter. When the transmitter turns at maximum speed of revolution in one direction, a counting signal is transmitted during each measurement interval and a maximum voltage is delivered; in the opposed direction, the polarity of the output voltage is reversed by evaluation of the directional datum; the overall result is a linear graph U(v), with U=0 for v=0.

Compared to optical or inductive transmitters, the remnants of the demodulated modulation frequency which are superimposed on the output signal may be filtered out more easily and the dynamics is improved due to the large bandwidth of the measurement system.

The inventive object of the present invention emerges not only from the objects of the individual claims but also from the combination between the individual claims. All the information and features disclosed in these papers, and in particular the embodiment illustrated in the drawings, are claimed as being essential to the invention, inasmuch as they are novel singly or in combination with regard to the prior art.

The invention is described in particular in the following with reference to drawings illustrating one possibility of embodiment only. For this purpose, other features essential to the invention and advantages of the invention emerge from the drawings and from their description.

BRIEF DESCRIPTION OF THE DRAWINGS

FIG. 6 shows a sector of a stator, FIG. 7 shows a sector of the rotor, FIG. 8a diagrammatically shows the arrangement of the coating sections in the area of the precision track, FIG. 8b is the illustration of the sinusoidal trace established by integration over the coatings, FIG. 8c shows a diagrammatical illustration of a differentiator, FIG. 8d shows the formula for calculation of the electrical angle and of the mechanical angle.

DETAILED DESCRIPTION OF THE PREFERRED EMBODIMENT

Figure 1:
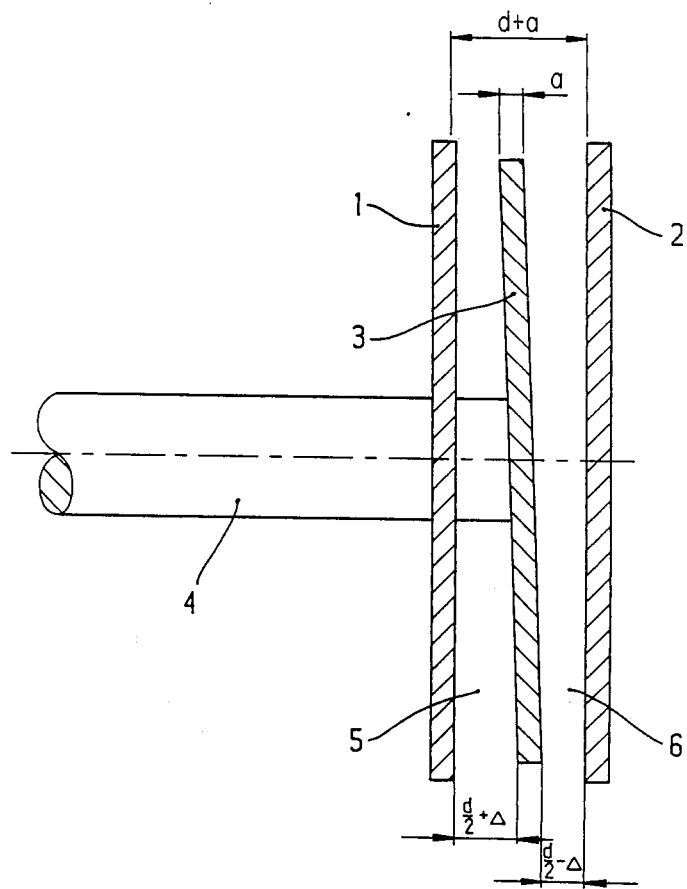
FIG. 1 shows a section through a rotary transmitter according to the invention, with an exaggerated illustration of a tilting displacement of the rotor.

In the gap between the stator 1 and the stator 2 is rotatably arranged a rotor 3, which is rotatably journalled in the casing via pivot bearings which are not illustrated, and which is furthermore rotatably coupled to a spindle 4 which is outwardly extended to the outside of the casing where it is rotatably coupled to the object of measurement.

In the present embodiment, the stators 1, 2 and the rotor are produced in the form of circular discs or plates. The external periphery of the stator and rotors is not crucial in this connection. All that is essential in accordance with the present invention is that the coatings which are to be described later, are annularly affixed on the said elements 1,2,3.

Provision is made in another form of embodiment of the present invention that the rotary transmitter is constructed as a linear transmitter. To this end, the rotor 3 is then linearly guided in a casing as an axially displaceable element and has its free extremity coupled to the object of measurement which is equally linearly displaceable.

In further elucidation of FIG. 1, it is stated that the thickness of the rotor is denoted by "a" and that the letter "d" denotes the gap between the two mutually confronted stators minus the thickness a of the rotor.

The electronic evaluation circuit which still remains to be described, may for example be arranged on the righthand side of the stator 2 in the casing and be covered by a casing lid which is not specifically illustrated.

The casing may also be of the hermetically encapsulated type, depending on the climatic conditions at the measurement location. Moreover, it is also illustrated in FIG. 1 of the drawings, that the rotor may be affected by a definite tilting or skewing defect; this skewing defect has been illustrated deliberately in an exaggerated manner in FIG. 1 to indicate that a perfect measurement result is also assured in the case of such considerable skewing defects.

As a matter of fact, it is apparent that in the position shown in FIG. 1, the rotor 3 has the air gap width d/2+Delta applicable to the air gap from the stator 1, whereas the oppositely situated side of the rotor has the reduced air gap width d/2−Delta applicable to the air gap from the Stator 2.

The measurement principle of the functional diagram according to FIG. 1 has as its basis that an air gap, e.g the air gap 5, is formed as a measurement gap between the stator 1 and the rotor 3, whereas the second air gap 6 is formed as a decoupling gap between the rotor 3 and the stator 2. The definition of these two concepts, namely "measurement gap" and "decoupling gap", will be specified later.

The measurement principle in the functional diagram according to FIG. 1 consists of conductor track patterns (coatings) applied between the stator 1 and the rotor 3 in the region of the measurement gap on the mutually confronted sides facing each other and separated by the gap 5 of the stator 1 and rotor 3 are capacitor coatings or "plates" of a capacitor network, the capacitance values of which depend on the angle of rotation (measuring capacitor system).

The conductor track patterns (coatings) on the mutually opposed sides of the rotor 3 and stator 2 form capacitors, the capacitances of which are ideally wholly unaffected by the angle of rotation; for this reason, these merely perform a decoupling function and the gap 6 between them is consequently described as a decoupling gap.

Figure 2:
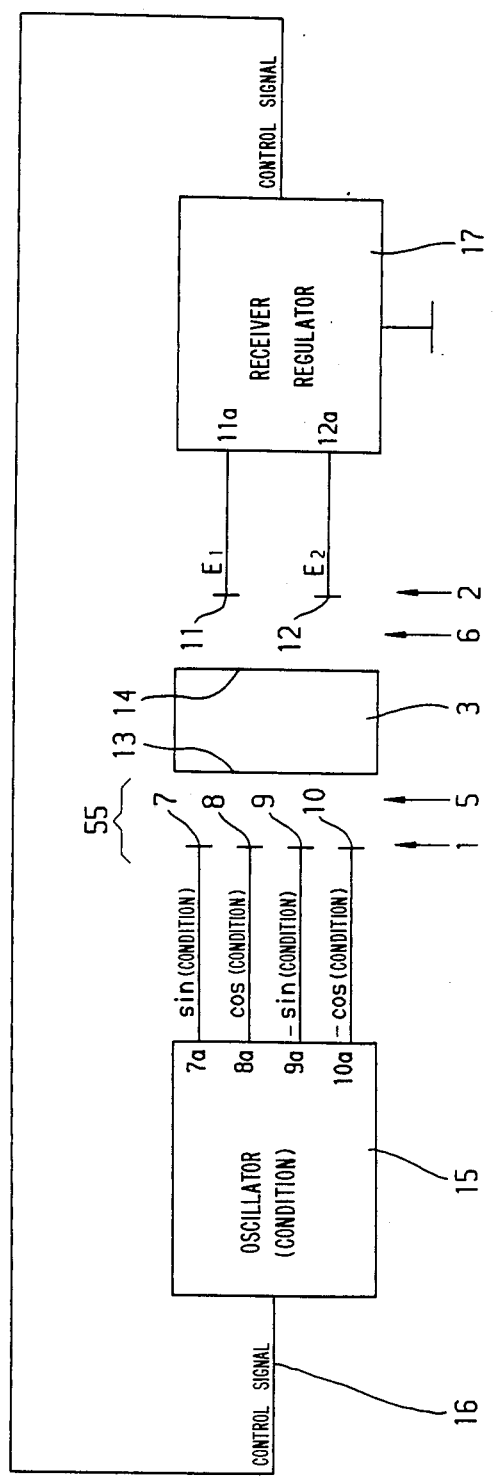
FIG. 2 shows a block circuit diagram of the electrical circuitry.

In the embodiment according to FIG. 2, which should merely be interpreted as an example, the rotor 3 has a coating structure 13 on the one side whereas a coating structure 14 is situated on the opposite side.

The coating structures 13 and 14 are interconnected by electrical contact means which still remain to be described.

Under separation by the gap 5, coating sections 7–10 are situated on the stator 1 opposite to the coating structure 13, these coating sections 7–10 being electrically separated from each other.

Each coating section 7–10 has a conductor 7a–10a allocated to it, said conductors forming the output of an oscillator 15, the input of which has a control signal leaving a regulator 17 as an output signal led in via the conductor 16. The input of the regulator is formed by conductors 11a,12a for this purpose, which for their part are again conductively connected to coating sections 11,12 of the stator 2.

The stator 2 is coupled capacitatively across the gap 6 (decoupling gap) to the opposite side, namely the coating structure 14 of the rotor 3.

The oscillator 15 is a free-running oscillator, being in particular a counter, which counts additively or subtractively, in which connection the counter is stopped in accordance with the control signal fed to the input of the oscillator 15, after which a sine, cosine, minus-sine and minus-cosine modulated amplitude with a particular measurement frequency is generated at its output side by means of the two measurement values applied in parallel with each other, so that this modulated signal may be transmitted across the gaps 5,6.

A more particular description of this principle will be given later in connection with FIG. 4.

The regulator 17, or rather the receiver, demodulates the measurement signal received from the coating sections 11,12 via its conductors 11a and 12a forming its input side and generates a control signal from the same, which acts on the input side of the oscillator 15 via the conductor 16.

Figure 3:
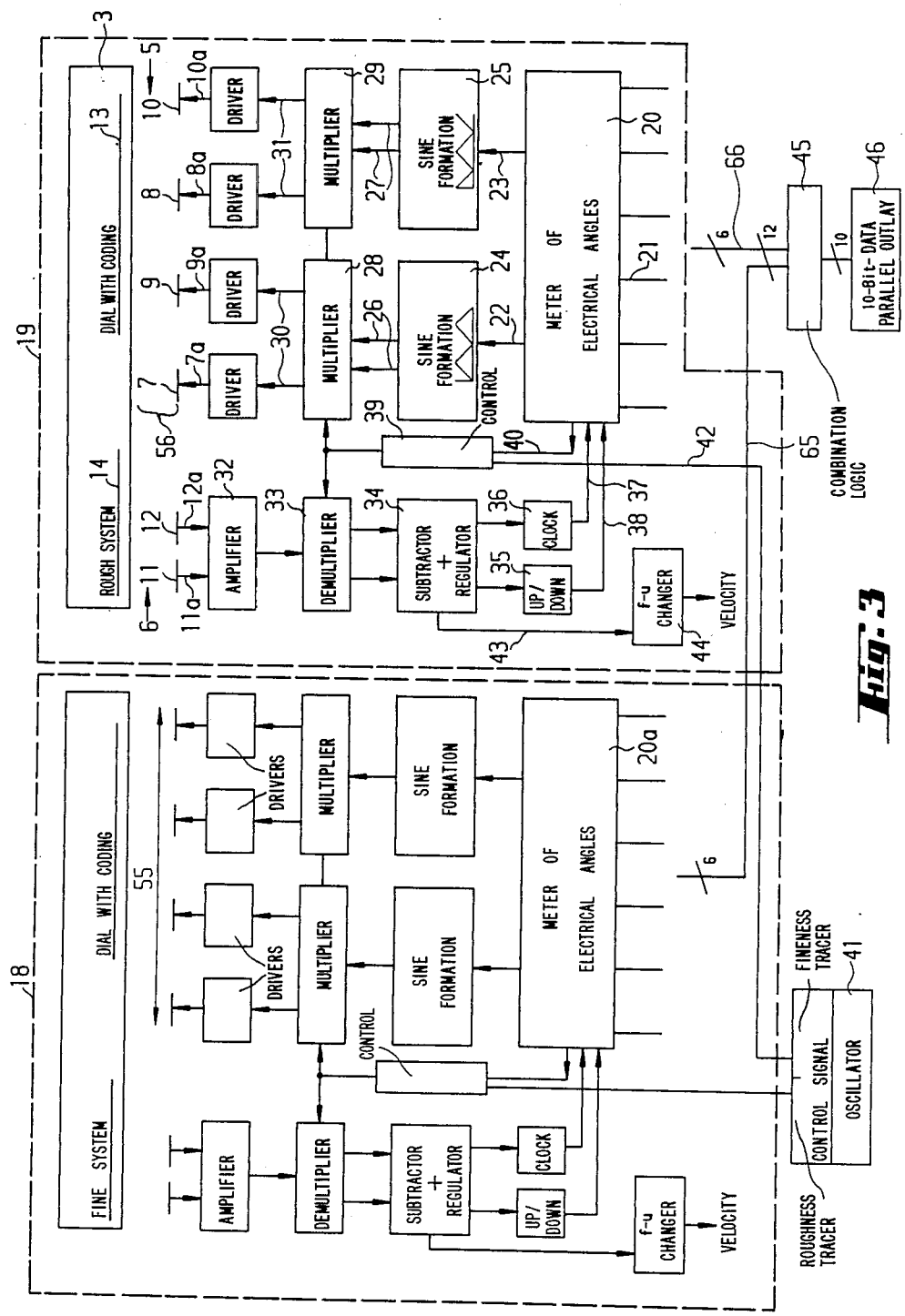
FIG. 3 shows a more comprehensive block circuit diagram of the evaluator circuit, as compared to FIG. 2.

FIG. 3 shows the overall circuitry in the form of a block circuit diagram. The block circuit diagram according to FIG. 3 comprises two substantially identical blocks 18 and 19 which are of identical structure but operate on different frequencies. To simplify matters, the function of one only of the blocks 18 or 19 will consequently be described, the other block operating in an analogous manner.

The oscillator 15 according to FIG. 2 substantially comprises a counter 20 the outputs 21 of which are led, for example as a six-wire cable, to a logic combination system which acts on and controls a 10-bit data-parallel output.

Depending on the bit state of the outputs 21, the conductors 22,23 have signals generated on them which are fed to a block 24,25 which generates a sine signal or a cosine signal, respectively, from the signal applied to the conductor 22,23.

If an angle of say 0° is fed in binary mode for example, from the counter 20 to the outputs 21, a specific condition is then obtained which is denoted by the term "state" in FIG. 2, and the graph shapes according to FIG. 2 are then generated on the conductors 7a–10a as a function of this angle, according to FIG. 2.

An alternating voltage having the amplitude 0 then appears on the conductors 7a and 9a, the maximum possible amplitude then appears on the conductors 8a and 10a; the signals of these two conductors are complementary to each other.

A sine signal consequently appears at the output 26 of the block 24, whereas a cosine signal is generated at the output 27 of the block 25. Both outputs 26,27 are connected in each case to a multiplexer 28,29 and each multiplexer 28,29 has two output conductors 30,31 which act on drivers, each driver acting on the associated coating section 7–10 via the associated conductor 7a–10a.

These signals are then transmitted capacitively across the gap 5 to the coating structure 13 of the rotor 3, whilst in the case of the decoupling gap 6, the coating structure 14 lies opposite to the coating sections 11,12 and a capacitive coupling is established with the coating sections 11,12, a differential amplifier being provided in the block 34 connected after the demultiplexer 33, which, from the two measurement push pull mode with respect to each other generates a single measurement signal which is fed to a regulator as an error signal.

If the error signal remains below a particular threshold, the following connected blocks 35,36 are so controlled that the counter 20 retains its actual counter reading; if the regulator output exceeds a specific upper threshold, the blocks 35,36 are so adapted in accordance with the signal that the counter 20 is caused to count one additive step. If the regulator output exceeds a lower limiting value, this has the result that the counter 20 is caused to count one subtractive step.

The two error signals coming from the output of the demultiplexer 33 are subtracted one from the other in the subtractor (block 34) so that a zero signal which does not affect the regulator is generated in the ideal case. The regulator is thus stable and does not cause any change of the counter 20 via the inputs 37,38. If a deviation occurs however between the two outputs of the demultiplexer 33, the signal generated by the subtractor 34 is no longer zero and acts on the regulator in the manner described above.

Whilst this occurs, the timing for the overall circuit is provided by means of the oscillator 41. A higher value bit of the counter 20 e.g. the MSB, is fed to the input 40 of the control 39.

The control 39 initially receives the master timing from the oscillator 41 via the conductor 42. The infeed of the bits of higher value on the wire 40 has the purpose of generating the sine, cosine, minus sine and minus cosine signals in the manner described.

In this connection it is apparent that a triangular positive signal is formed in the block 24, which is shaped into a sine signal by the following connected elements (multiplexer, driver), whereas in the case of the block 25, a cosine signal is shaped by the following elements.

These graph shapes are generated notwithstanding the nature and magnitude of the error signal.

Provision is made in a development of the present invention that a speed signal is decoupled from the frequency-speed converter 44 via the wire 43, out of the block 34 containing the subtractor and regulator. This speed signal has the purpose of obtaining the speed of revolution of the measured object as supplemental information.

A binary output signal is generated in the logic combination system 45 from the outputs of 6-bit amplitude in each case of the counters 20 and 20a, which signal is fed to a parallel output 46 of 10-bit amplitude, the output of which permits detection and further processing of the analog angle of rotation as a 10-bit signal.

In the logic combination system, the signals of the precision measuring system corresponding to the block 18, and the signals of the coarse measuring system corresponding to the block 19 are summated, and 2 bits are removed whilst doing so to achieve a perfect superimposition of the two signal systems. Another description of the function is given with reference to FIGS. 13 and 14.

Figure 4:
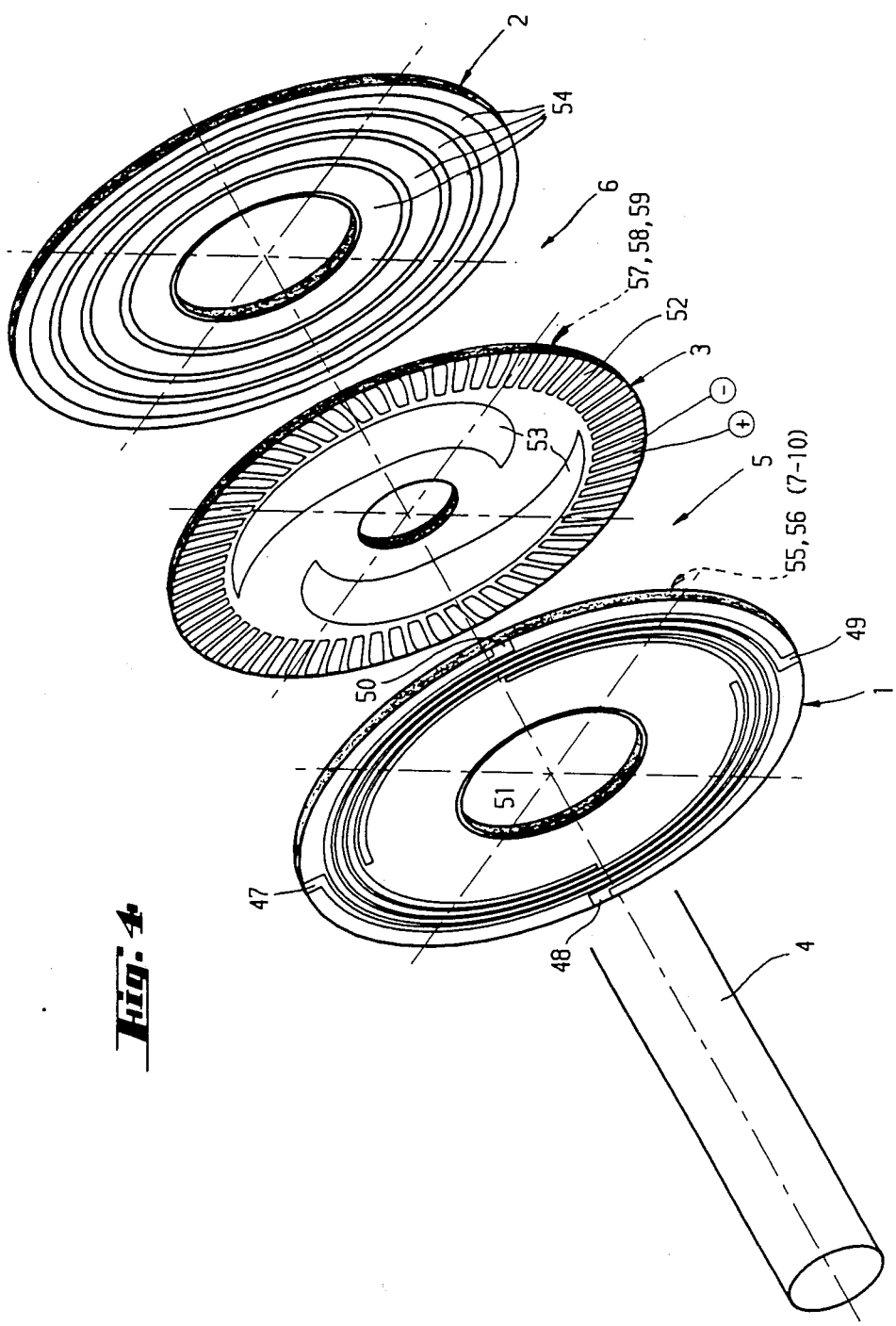
FIG. 4 shows a front view in perspective of the rotary transmitter.
Figure 5:
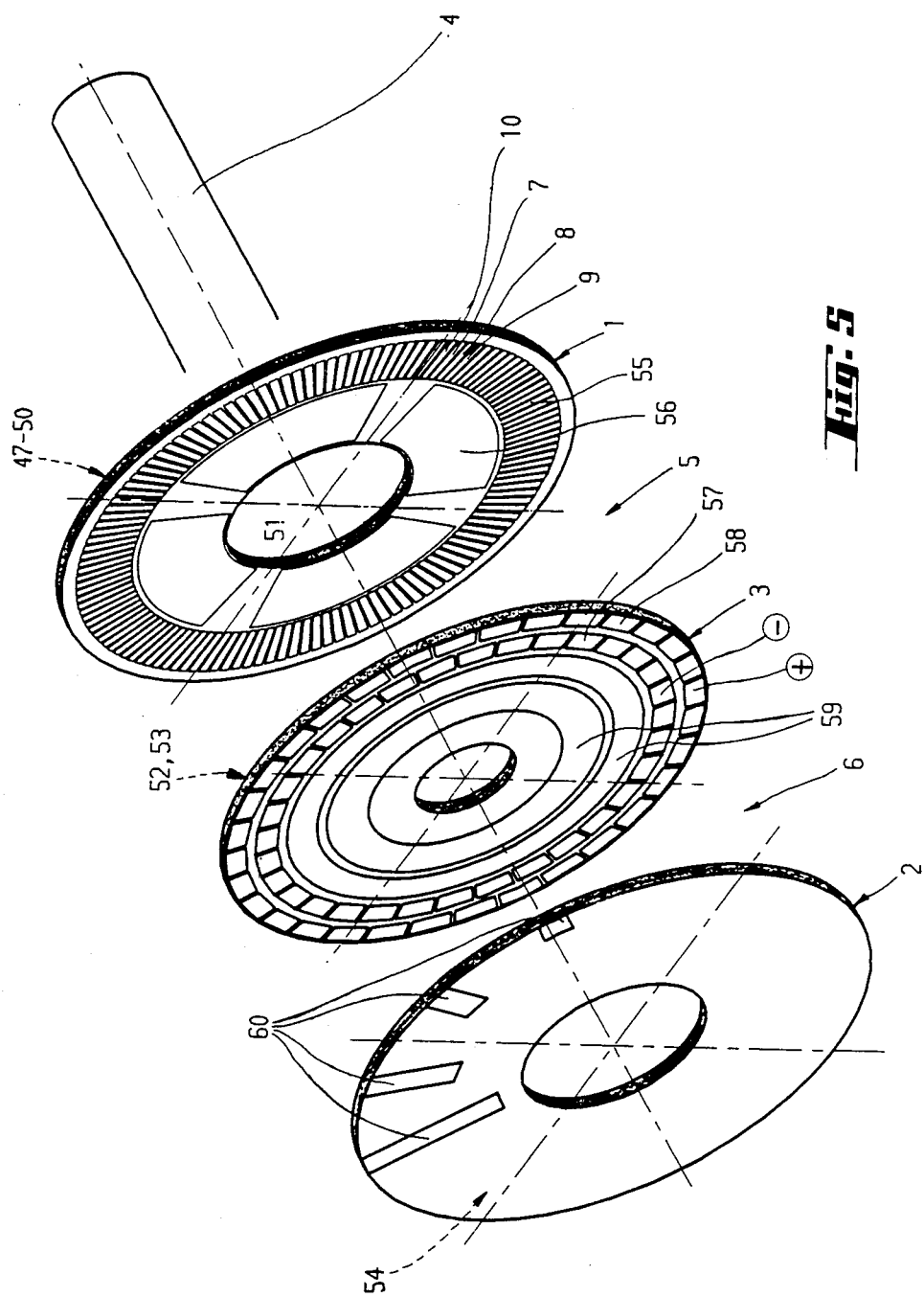
FIG. 5 shows a rear view in perspective of the rotary transmitter in an exploded form of illustration.

FIGS. 4 and 5 are detailed illustrations of a practical embodiment of an angle of rotation transmitter according to the present invention, FIG. 4 illustrating the front view of the angle of rotation transmitter and FIG. 5 the rear view of the angle of rotation transmitter.

Four spirally shaped conductor tracks 47–50 are situated on the front side of the stator 1, the starts or junctions of the conductor tracks being arranged on the periphery in approximately uniform distribution and the separate conductor tracks 47–50 being so wound spirally within each other that they have a precise constant mutual spacing and do not come into contact.

They serve the purpose of interconnecting the coating sections 7–10 situated on the rear side of the stator 1 (see FIG. 5) via through-contact means to be described hereinafter, i.e. all the coating sections bearing the reference symbol 7 are joined together by means of a spirally shaped conductor track, e.g. the conductor track 47, whereas the other coating sections are joined together correspondingly. To this end, the coating sections 7–10 form part of the structure defined as the coating 55.

The spindle 4, which is rotatably coupled to the rotor 3 in the manner described in the foregoing, passes through the inner opening 51 of the stator 1.

Individual coatings 52 in the form of elongated conductive strips, which are part of the fine or precision measuring system, are arranged with mutual spacing and mutually parallel on the outer periphery at the side of the rotor 3 shown in FIG. 4, whereas the coatings 53 situated on the inner area of the rotor 3 are part of the coarse measuring system.

The nature, meaning the arrangement and shaping of the coatings 52,53, is defined in the descriptive preamble, in the mathematical functions specified in the same.

These are so shaped that the areas of overlap of mutually opposed coatings, e.g. of the coatings 52 on the rotor 3 with respect to the coatings 55 comprising the coating sections 7–10 on the stator 1, vary sinusoidally part by part during rotary displacement. An infinite number of possibilities arises in respect of shaping. The shape selected in the case of the practical embodiment is based on the fact that the coating sections 7–10 of the coating 55 of the stator 1 have a constant charge density within an angular range which is to be determined, whereas for example the coatings 52 of the rotor 3 have a charge density corresponding to a sine function.

Concentric conductive annular tracks are shown on the side of the stator 2 which is apparent in FIG. 4, four such elements forming part of the decoupling gap 6 preferably being present altogether.

According to FIG. 5, the coatings 55 allocated to the fine or precision track are circularly arranged on the outer circumference of the stator 1, on the inward side of the stator 1, whereas the coatings 56 allocated to the coarse track are arranged in uniform circular distribution on the inner periphery of the stator 1.

The shaping of the coatings 55 corresponds to the definition given in the foregoing (constant charge density), 4×16 coatings 55 being present in a preferred embodiment, which form the fine track and four coatings 56 which form the coarse track.

Coatings 57,58 having the form of annulus sections and radially staggered with respect to each other, are arranged in the region of the fine track 2 on the rear side of the rotor 3. It is essential in this connection that the radial length of the coatings 52 situated on the front side of the rotor should coincide with the radial length of the two coatings 57,58, so that two adjacent coatings 52 on the front side of the rotor may in each case be considered as having opposed polarity, and each coating 52 of identical polarity then has allocated to it either the coating 58 or the coating 57. Each equipolar element of the coating 52 is connected to an element of the coating 58, for example whereas each element of opposed polarity of the coating 52 (this means every second element of the coating 52) is connected in each case to an element of the coating 57.

The annular coatings 59 on the rear side of the rotor 3 are allocated in each case to the coatings 53 forming the coarse track on the front side of the rotor 3 (see FIG. 4).

The annular tracks 54 on the one side of the stator 2 shown in FIG. 4 are joined on the rear side and according to FIG. 5 to contact tracks 60 in each case, which are connected to the electronic evaluator system via appropriate contacts.

Two conductors of the contact tracks 60 in each case form the conductors 11,12 of the coarse measuring system or the conductors 11a,12a of the fine measuring system.

FIG. 6 shows an annular sector of the stator 1 illustrating, respectively, the coatings 55 situated on the front and rear sides and comprising the coating sections 7-10 and the conductor tracks 47-50 which interconnect particular coating sections.

To this end, through contact means 61 are so placed in an appropriate manner, that the conductor track 47 is for example joined to the coating section 7 via appropriate through-contacts 61, whereas the conductor track 48 is joined to the coating section 8, and the conductor track 49 is joined to the coating section 9, and the conductor track 50 is joined to the coating section 10.

It is apparent on the radially inward side of the annular-sector of the stator 1 that the coating 56 allocated to the coarse track equally has the shape of an annular sector and is joined via a through-contact 61 to a terminal so that it may be connected to a corresponding wire.

In an analogous manner, FIG. 7 shows a sector from the rotor 3, in which it is apparent that the coatings 58 and 57 allocated to the fine track, which are both illustrated by broken lines, are in each case connected via appropriate through-contacts 61 to the coatings 62 situated on the other side, in the same manner as described in the foregoing.

It is equally apparent that the crescent-shaped coatings 53 which are allocated to the coarse track of the rotor 3, are connected via appropriate through-contacts to the annular coatings 59 on the other side of the rotor.

FIG. 8a illustrates the development in the plane of the coatings 56 of the stator 1, the illustrations in FIGS. 8a and b being applicable for the development of the coarse track as well as for the development of the fine track coatings. The coating sections 7–10 of the coatings 55 of the fine track of the stator 1 were also entered on the drawing for this reason. To simplify matters, no more than the functions of the coarse track coatings 56 are described in the following; the description is then also applicable in analogous manner to the coatings 55 allocated to the fine track.

FIG. 8b shows the linear development of the crescent shaped coatings 53 of the coarse track of the rotor 3. FIG. 8c is an illustration of a circuit diagram, of the manner in which a difference is obtained from the two areal elements E1 and E2, which leads to the signal S appearing at the output of the subtractor. FIG. 8d shows the formula for the error signal which is generated from the electrical and mechanical angles.

The spacing between the rectangular coating sections 7–10 of the coatings 56 has not been illustrated in FIG. 8a, to simplify matters.

The hatched area in FIG. 8b is the area corresponding to the measurement quantity. In the embodiment illustrated, the coatings 53,56 of FIGS. 8a and 8b form a comparison selected at will.

If the evaluator circuit is then selected in such manner that the minus E2 coating which is shown hatched at the top in FIG. 8b acquires the reversed polarity, this coating is then folded over downwards, thereby obtaining the chain-dotted curve of an ideal sine.

Since an intermittent sine is thus formed in this case, a wholly continuous (steady) sine graph is obtained by consecutive connection of these coatings.

For example, the signal E1 is the area summation of the signals of the coatings 9,8,7 in the section 62, so that this integration of the signals of the coatings yields the voltage E1 from which the error signal is then generated according to the upper formula in FIG. 8d, which signal is then a function of the electrical angle as well as of the mechanical angle according to the preceding explanation.

The offset according to FIG. 8d provides a first datum quantity which is unchanged during the measuring operation, which applies to the fastening of the casing, of the spindle as well as to the components contained in the casing.

Figure 9:
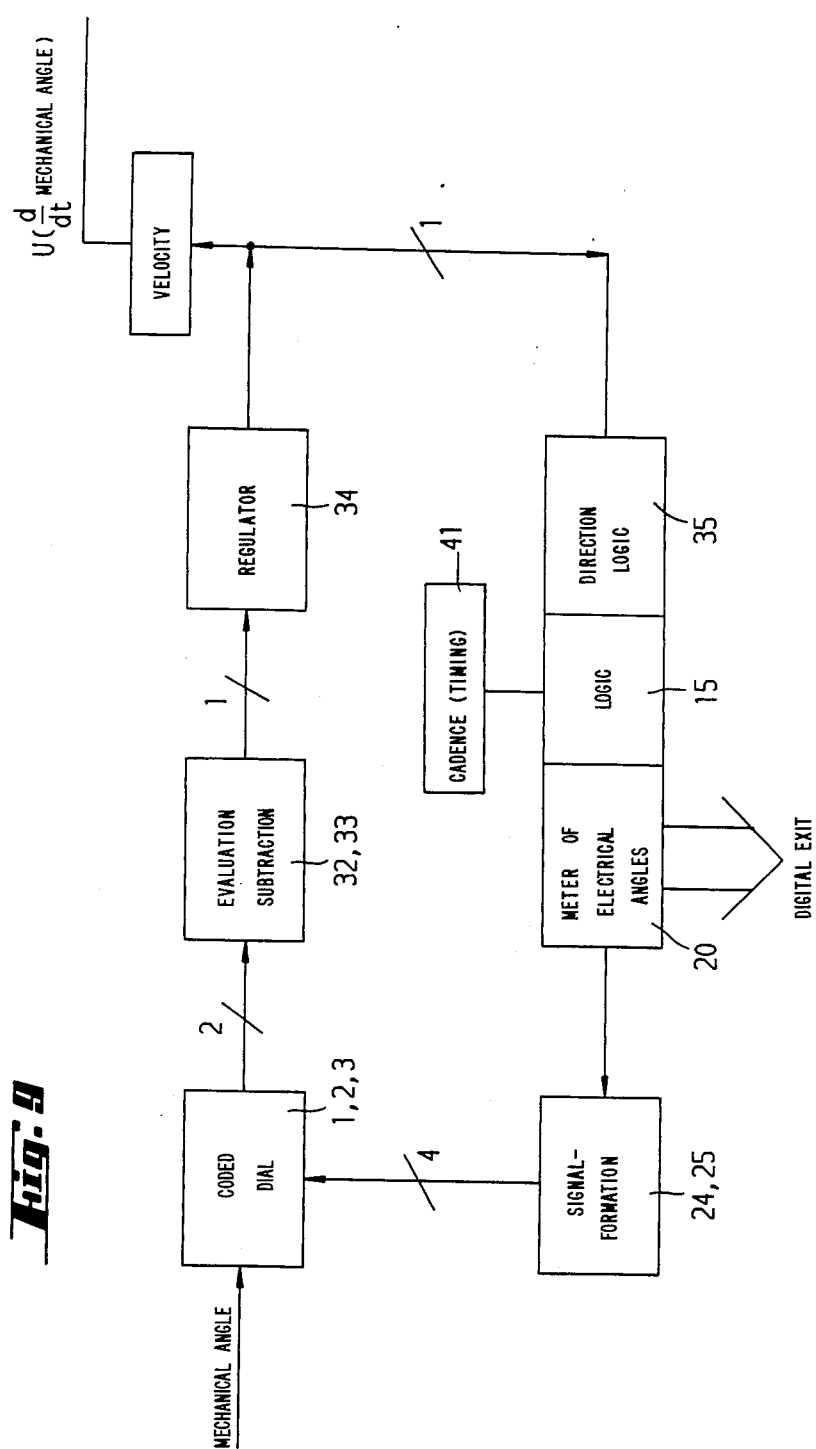
FIG. 9 shows an embodiment of the evaluator circuit modified as compared to FIG. 2, FIG. 10 diagrammatically shows the angular indication of the coarse track, FIG. 11 diagrammatically shows the signal combination of the signals of the coarse track and of the precision track.

FIG. 9 again shows the control circuit system corresponding to the circuitry described with reference to FIG. 3, a simplified block circuit diagram being illustrated, the parts depicted in FIG. 3 being present in FIG. 9 and the same description consequently being applicable to these parts as for FIG. 3.

This demonstrates that this is a closed control system which converges towards the true measurement value after being energised, and follows the latter in the course of the measuring operation.

Figure 10:
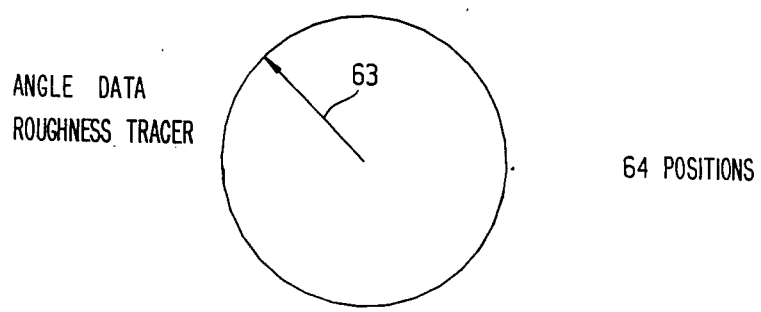
Figure 11:
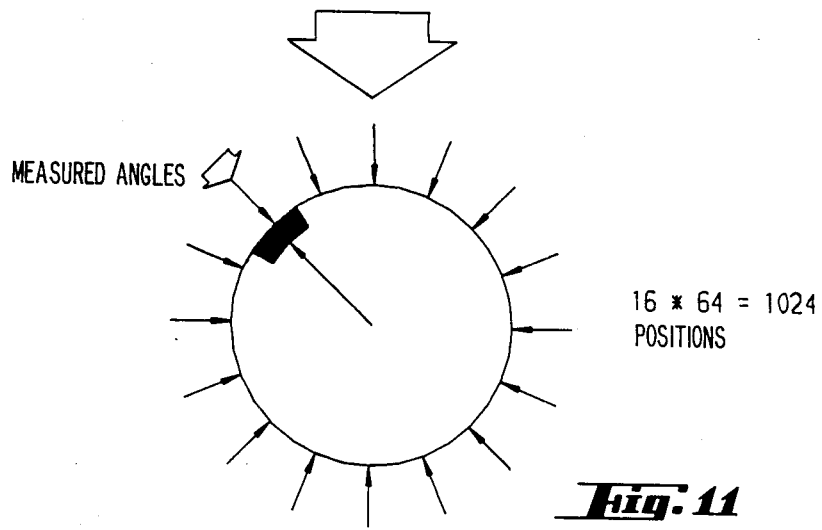
Figure 12:
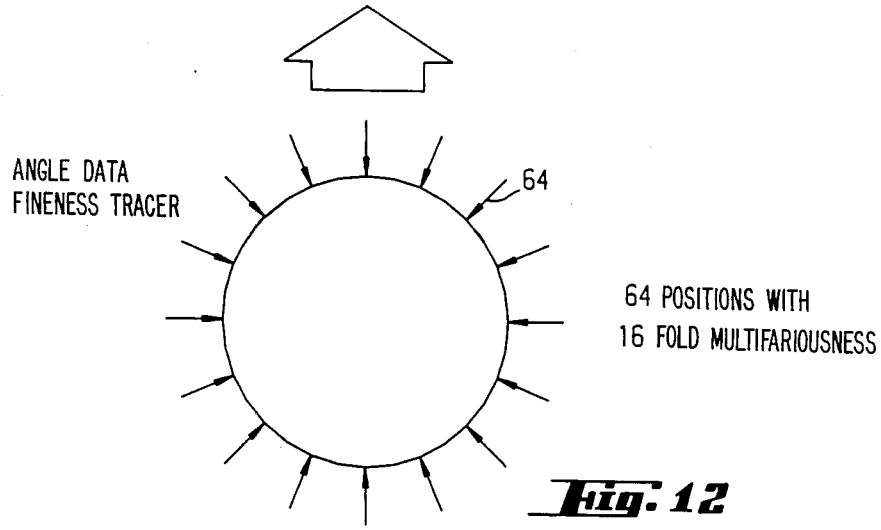
FIG. 12 diagrammatically shows the angular indication of the precision track.

FIGS. 10 to 12 show in diagrammatical form how the signals of the coarse track are combined with the signals of the fine track, so that a signal of a high degree of resolution with a function of the absolute type is achieved.

It is shown in FIG. 10 how the pointer 63 of the coarse track indicates the angle on an absolute basis—but with little precision and resolution. In FIG. 12, measurement value for the angle is however provided with an ambiguity by the other system with a higher degree of resolution. In FIG. 11, the angle which had actually occurred is determined from the measurement values, or rather the pointers in FIGS. 10 and 12. The inaccuracy in FIG. 10 and the ambiguity in FIG. 12 are thus eliminated and an angle measurement is established with the advantages of FIG. 10, namely that of the absolute function, and with the advantage of FIG. 12, namely precision, without their individual shortcomings.

Figure 13:
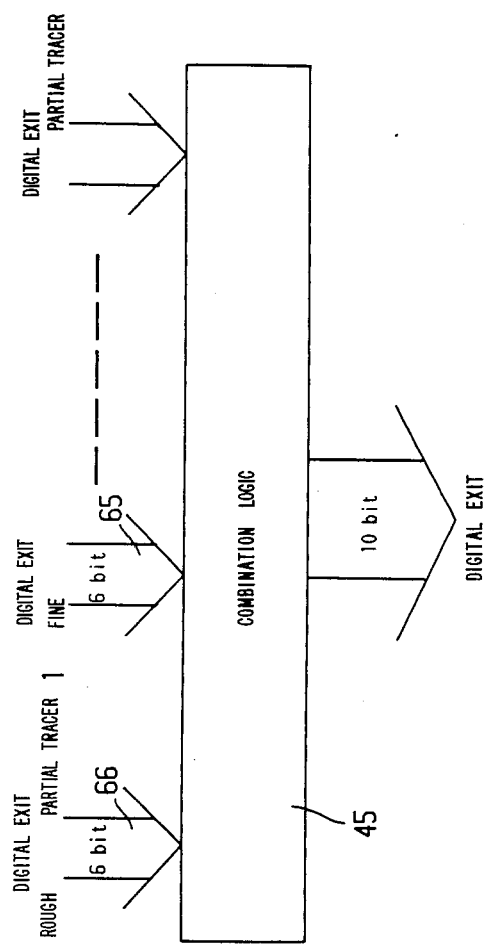
FIG. 13 shows a functional diagram of the manner in which the digital output signal is obtained in the logic combination system.

FIG. 13 shows the convergence of the signals of the coarse track and of the fine track, in which connection it is shown as a generalisation that other signals may also be fed in, e.g. from a medium-resolution track or from other tracks.

This shows that the output of the fine track having an amplitude of 6 bits and coming from the conductor 65 in FIG. 3 is joined to the conductor 66 from the coarse track, which equally provides an amplitude of 6 bits, and that both signals are combined in the logic combination system 45 and supplied as a data output of an amplitude of 10 bits, to a digital evaluator circuit. The combination of these two channels of 6-bit amplitude in the logic combination system occurs as follows:

The 6 bits of the fine track are taken over directly in the digital output signal, as the six bits of the lowest value or weight. The four bits of highest weight of the coarse track are either reduced by one, increased or left unchanged as a function of a combination which is still to be specifically described, and form the higher four bits of greater weight of the digital output signal. The two bits of highest weight of the fine track and the two bits of the lowest weight of the coarse track represent the area of overlap; they are approximately equivalent and permit a conclusion to be derived from them as to whether the previously described bits of the greatest weight of the signal are left unchanged or not.

Due to this action, it is assured that the output signal does not jump in the case of irregular bit transitions in the coarse and fine tracks, respectively. In this connection, there is a special measure, which assures that the two tracks, namely the coarse and fine tracks, are displaced in phase with respect one to the other, so that the four maximum weight bits of the coarse track are thereby either only increased or left unchanged. This reduces the electronic complexity in its embodiment because no more than a switchable incrementor is required instead of a full summator.

Figure 14:
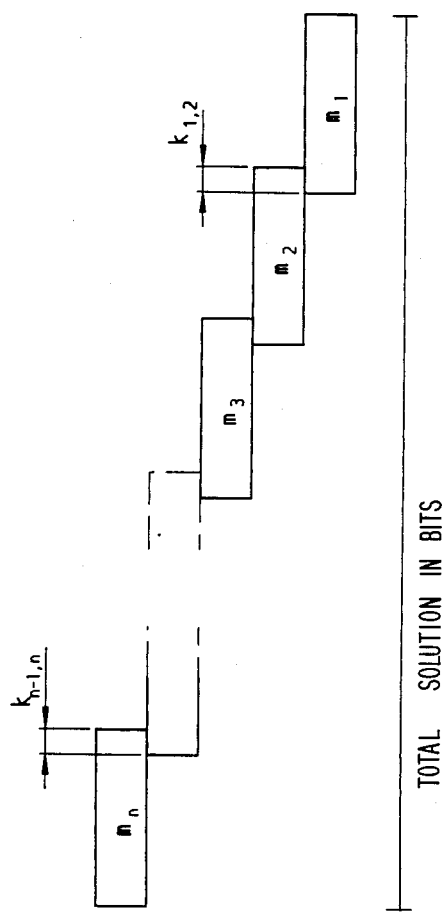
FIG. 14 shows bits for obtaining the digital output signal.

The combination of the individual bytes is shown in FIG. 14, with an illustration of the area of overlap. If $m_1$ is the overall width of the finest track, and $m_2$ that of the coarse or coarser track, $K_{1'2}$ then represents the area of overlap which has the consequence in the logic combination system that the logic combination system is activated within this range and assures that the bit transfers in this area reach the output.

The reduction of the amplitudes of the individual tracks to the overall amplitude of the output term is apparent, actually meaning that $m_1 + m_2 - K_{1'2}$ is the amplitude of the output signal of the system.

This figure furthermore illustrates the generalisation that a total of n tracks is present, whereas no more than two tracks were shown, merely as an example of the present embodiment.

An overall resolution of 10 bits is obtained, e.g. in the case of a resolution of 6-bit amplitude for $m_1$ and of a resolution of 6-bit amplitude for $m_2$, because the area of overlap lies in the region of 2 bits.

This principle of resolution or this principle of combination, is applicable to an optional number of tracks.

Figure 15:
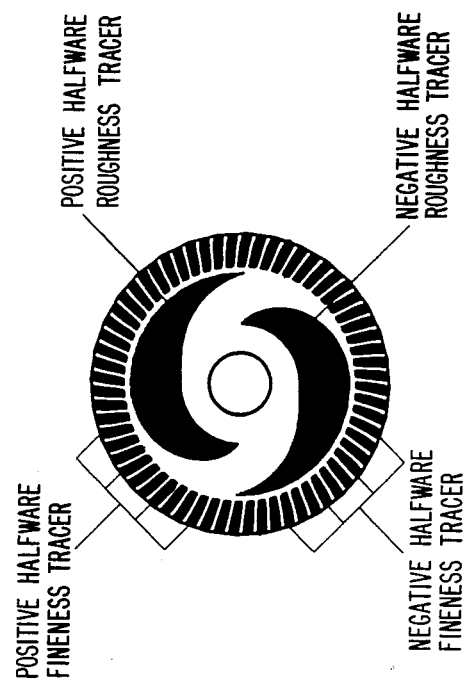
FIG. 15 shows diagrammatically the sinusoidal form of the electrodes on the rotor.

FIG. 15 shows the plan view in diagrammatical form of the rotor, having the advantage of a resolution unaffected by the angle if a satisfactory linearity is obtained.

It should be observed that the coatings need not necessarily be applied as metallic surfaces on an insulating material, rather another embodiment is specified in which use is made of an insulating material which provides the same capacitance modulation. This is understood to mean that the coatings of the rotor together with the underlying volumetric elements of the rotor form volumes which are filled with a different dielectric. This means that these volumes have a different dielectric constant from that of the adjacent volumetric elements.

What we claim is:

1. A capacitive rotary transmitter for controlling and positioning displaced objects by measuring any of the three characteristics of displacement, angle, speed, of a displaced object, is formed by two mutually opposed stators defining a reciprocal spacing, the spacing having rotatable in it a rotor which is rotatably coupled to a spindle which is coupled to the displaced object, the rotor having a front side and a rear side, the spacing including a first space between one stator and the rotor and a second space between the other stator and the rotor with electrically conductive coatings on mutually confronting sides of the stators and the rotor, the coatings together with the associated spaces forming capacitors respectively, the capacitance value of which varies with the rotation of the rotor, characterized in that, the coatings are so arranged on the rotor and the stators that they form at least two concentric annular areas, of which one area forms the measurement track of a coarse measuring system and the other forms the measurement track of a fine measuring system, the coatings of the fine measuring system being periodically arranged with respect to a fraction of 360° on annular tracks of the rotor and stators, and the coatings of the coarse measuring system being periodic with respect to 360°, so that the coupling capacitance generated by the mutually associated coatings of the rotor and stators, by the rotation of the rotor, have a graph along the rotor displacement of the spindle which is sinusoidal and that by addition of reciprocally displaced partly sinusoidally extending capacitance graphs tagged with different prefix signs, an approximately purely sinusoidal capacitance graph having a period of $360°/n_i$ is generated, $n_i$ being a positive natural integer and indicating the pole pair number of the particular measurement track and the index i denoting the number of measurement tracks.

2. A rotary transmitter according to claim 1, wherein, in case of the presence of a fine track and of a coarse track, four different coating sections of identical configuration are situated on a coating of the stator, and in which connection each kind j, where j is any number from 1 to 4, of a coating section is displaced by $$j \times \frac{360°}{4 \times n_i} + k \times \frac{360°}{n_i},$$

where k is an optional integer,
with respect to another kind of coating section relative to a zero angle, and that two kinds of coatings on the rotor are displaced by $$l \times \frac{360°}{2 \times n_i} + k \times \frac{360°}{n_i}$$

with respect to a zero angle fixed relative to the rotor.

3. A rotary transmitter according to claim 2, wherein in the area of the coating of the fine track, each coating section of each stator is energised with one of the following signal voltages:

$U_1 = U_o \bmod \times \sin(n_i \times \phi)$
$U_2 = U_o \bmod \times \cos(n_i \times \phi)$
$U_3 = U_o \bmod \times (-\sin(n_i \times \phi))$
$U_4 = U_o \bmod \times (-\cos(n_i \times \phi))$ in which $U_o$ mod is a modulation voltage and $\phi$ the electrical angle, and the two kinds of coatings of the rotor are connected in phase opposition after decoupling on the stator to a preamplifier, the output signal of which is demodulated and after reshaping follows the signal graph $U_{out} = U_o \times 2 \times \sin n_i(\theta - \phi)$ $\theta$ being the mechanical angle, and the equation $\theta = \phi$ applying by variation of $\phi$, $U_{out}$ being controlled to zero only for discreet values of $\phi$ and indicating the deviation of $\theta$.

4. A rotary transmitter according to claim 3, wherein each measurement track has allocated to it an electronic track evaluator system which within the scalar period $360°/n_i$ determines the position with a resolution of $a_i$ bits, the electrical angle $\phi$ being made to follow the mechanical angle $\theta$ and the electrical angle $\phi$ being stored with $a_i$ bits in the counter.

5. A rotary transmitter according to claim 4, wherein the digital output of the coarse measuring system is combined with the digital output of the fine measuring system in a logic combination system, the digital output signal of the logic combination system being reduced by at least two bits by comparison to the sum of the bit amplitude of both inputs of the logic combination system, and in the case of a 6-bit amplitude output of the fine measuring system, all the bits being taken over directly into the 10-bit amplitude output signal of the logic combination system, the four highest-weight bits of the 6-bit amplitude digital output of the coarse measuring system being either incremented or decremented by 1 bit or left unchanged as a function of whether the linkage between the two highest-weight bits of the fine track with the two lowest-weight bits of the coarse track assumes a specific value.

6. A rotary transmitter according to claim 1, wherein the rotor and the stators are produced from an insulating material and that the coatings are produced from conductive material and the electrical connections between the coatings on the front and rear sides of the rotor and stators are established by means of through-contacts passing through the insulating material.

7. A rotary transmitter according to claim 6, wherein the one side of one of the stators has arranged on it four spiral conductor tracks which are connected to associated conductors and that the conductor tracks are connected via through-contacts to the coating sections present on the other side of the stator and appertaining to the coating of the fine track, in such manner that in the case of the presence of four differently polarised coating sections, a signal voltage is fed to each coating section.

8. A rotary tramsmitter according to claim 7, wherein the charge density associated with the fine track, of the coating sections of the coating of said one stator is constant and the coatings situated on the front side of the rotor and opposite to the coating sections of said one stator have a charge density corresponding to a sine function, and the areas of overlap of the mutually opposed coatings of the rotor and said one stator vary sinusoidally progressively during rotary displacement of the spindle.

9. A rotary transmitter according to claim 7 or 8, wherein
the rear side of the rotor has provided on it in the area of the fine track, two circular rings radially staggered with respect to each other, and of electrically separate coatings, the radial length of the rings coincides with the radial length of the coatings situated on the front side, each equipolar coating section of the coating being joined to an element of the coating and each oppositely polarized coating section of the coating being joined in each case to an element of the coating.

10. A rotary transmitter according to claim 1, wherein the coatings are formed of an insulating material having a different dielectric constant than that of the material of the other surfaces of the rotor.

11. A rotary transmitter according to claim 10, wherein the dielectric constant of said insulating material is higher than that of the material of the said other surfaces.

12. A rotary transmitter according to claim 1, wherein to eliminate a tilting and/or eccentricity error on the rotor in the area of the fine track, the coatings of identical polarity situated on the front side with mutual spacing are insulated from each other and are in each case individually connected to coatings associated with them on the rear side.

13. Capacitive linear transmitter for controlling and positioning of displaced objects by measuring the displacement or speed of the displaced object, which comprises two mutually opposed stators defining a reciprocal spacing there being rotatably arranged a rotor which is fixedly connected with a slide which is drivingly coupled to the displaced object, said spacing including a first space between one stator and the rotor, and a second space between the other stator and the rotor, with electrically conductive coatings on mutually confronting sides of the stators and the rotor which together with the associated spaces form capacitors between the rotor and stators respectively, the capacitance value of which varies with the displacement of the rotor, characterized in that,
the coatings are so arranged on the rotor and the stators that at least two concentric parallel areas result, of which the one area forms the measurement track of a coarse measuring system and the other area forms the measurement track of a fine measuring system, the coatings of the fine measuring system being periodically arranged with respect to a certain length on parallel tracks of the rotor and stators, and the coatings of the coarse measuring system being periodic with respect to a total length, the coupling capacitances generated by the mutually associated coatings of the rotor and stators having a graph along the displacement of the sides which is sinusoidal in portions thereof and by addition of reciprocally displaced partly sinusoidally extending capacitance graphs tagged with different prefix signs, an approximately purely sinusoidal capacitance graph having a period of $360°n_i$ is generated, $n_i$ being a positive integer and indicating the pole pair number of the particular measurement track and the index i denoting the number of measurement tracks.

* * * * *